May 4, 1965 J. R. SORRELLS ETAL 3,182,205
LOGIC PACKAGE INCLUDING INPUT GATING MEANS
D.C. COUPLED TO AMPLIFIER
Filed Jan. 15, 1962 2 Sheets-Sheet 1

INVENTOR.
John R. Sorrells
BY Arthur W. Holt
Joseph A. Genovese &
Max L. Libman
ATTORNEYS INVENTOR.
John R. Sorrells
BY Arthur W. Holt
Joseph A. Genovese &
Max L. Libman
ATTORNEYS

United States Patent Office 3,182,205
Patented May 4, 1965

3,182,205

LOGIC PACKAGE INCLUDING INPUT GATING MEANS D.C. COUPLED TO AMPLIFIER

John R. Sorrells, Rockville, and Arthur W. Holt, Silver Spring, Md., assignors, by mesne assignments, to Control Data Corporation, Minneapolis, Minn., a corporation of Minnesota Filed Jan. 15, 1962, Ser. No. 166,043
3 Claims. (Cl. 307—88.5)

This invention relates to electronic modular sub-assemblies now commonly called "packages," and particularly to packages that are especially useful in the construction of computers and other equipment using logic.

Packages are now widely used in the construction of certain kinds of electronic equipment. Undoubtedly, the comparatively recent developments in manufacturing printed circuit boards, and innovations in the miniaturization of components are contributing factors to the now common use of packages. Packages are used in the construction of almost all computers and computer-like equipment, such as electronic reading machines. This equipment is especially suitable for modular construction, because, among other reasons, it requires a comparatively small number of different kinds of logic elements, but in very large quantities.

The present invention provides a logic package which is considerably more versatile than previous packages of comparable cost and complexity.

Regarding versatility, it is obvious that one could construct a complex package having numerous completely wired logic components such as flip flops, shift register, counters, etc. That package would be versatile, but would be costly and in practical use, many of the completely wired logic components would be superfluous. Our package does not use this approach to the problem. We have only elementary building-block circuits such as gates, differentiators, an amplifier and delay network, and apart from the gating, all other complete logic components (e.g. flip flops, counters, etc.) are formed by the particular interconnections of the elementary building blocks within the package and/or connections with other similar packages.

Accordingly, the object of the invention is to provide a logic package possessing greater versatility than previous packages of comparable cost and complexity.

In addition to the above general objective, our logic package posses improvements in certain of the logic components or elements formed by the package. For example, an often-used logic element is a one-shot multivibrator. Our multivibrator itself possesses the features of being exceedingly simple yet, it is easy to adjust the duration of the pulse (pulse length) of the one-shot.

Since we prefer that our logic package use a printed circuit board as its base, it is convenient to use standard sockets and taper pins along one edge of the board to make all the necessary internal and external connections for the package, including those to interconnect package circuits to form logic elements such as flip flops, quantizers, etc. Consequently when a jumper is required to make internal or external connections it can be attached to the appropriate socket points corresponding to the proper taper pin terminals of the logic package.

We are aware of many prior modular units. For example, certain of the earliest electronic computers constructed at the National Bureau of Standards used pulsed amplifiers with a very wide variety of input gating. The construction was not precisely a "package" as is known at the present time, but a much more important distinction between our present invention and the modular construction referred to above, is that the very early computer packages built at the National Bureau of Standards used pulse logic. In other words, what corresponded to "packages" required clock pulses for their operation. This point is emphasized because our present invention is not a "pulsed logic" device or at least, is not essentially so. It is possible to operate our package in an A.C. mode so that it would, in general, correspond to a "pulsed logic" package, but this is the unusual and not the preferred use of our package.

Instead, we have a D.C. coupled amplifier capable of operating in two steady states, which, for convenience, are called "Off" and "On." When the amplifier is "Off," output signals are available on two output lines which are termed "Assertions," and "Negations." By definition, the assertion is considered as a "function" and the negation is considered as a "Not function." When the amplifier is turned "on" the signals on the assertion and negation lines become inverted. The swing of signals may be about any arbitrary reference, for example zero volts. The magnitude of the output is a design feature, but for convenience of subsequent description we shall assume that the outputs are nominally +6 volts and −6 volts respectively. The availability of the assertion and negation signals provides a very powerful tool in the construction of logic circuits, as is well known in the art.

Other objects and features of importance will be confirmed in following the description of the illustrated form on the invention.

*Summary preface*

Figure 1:
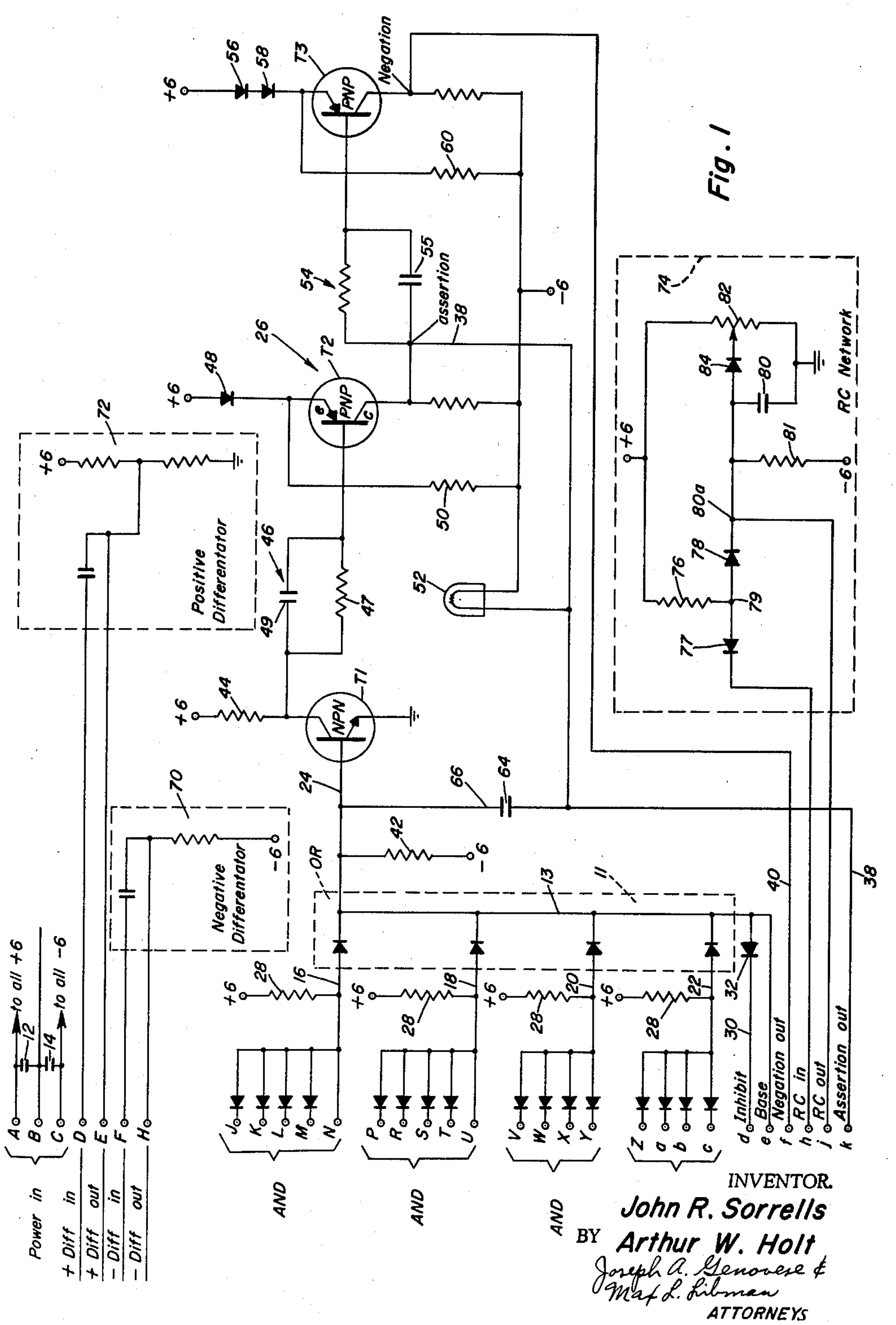
FIGURE 1 is a circuit diagram showing the elements of our logic package.
Figure 2:
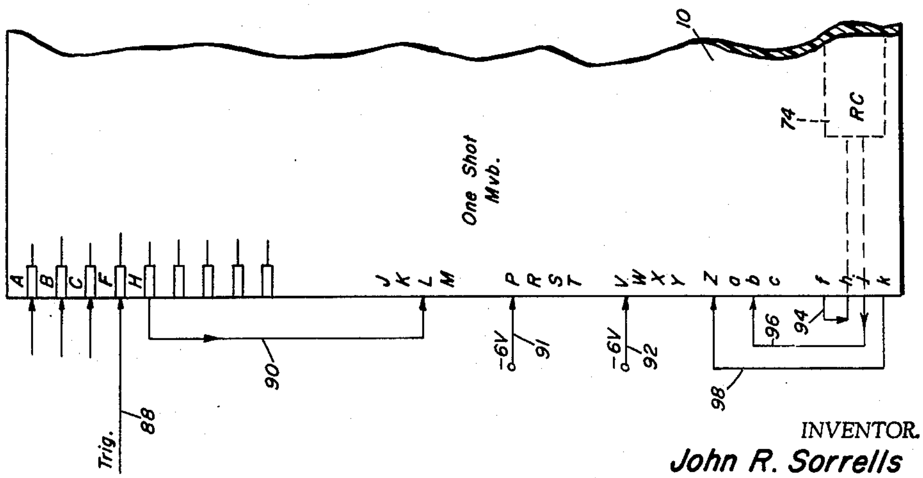
FIGURE 2 is a fragmentary elevational view showing how the package of FIGURE 1 is connected to form a one shot multivibrator.

FIGURE 1 shows the entire circuit of our logic package, and FIGURE 2 shows that we prefer to use a printed circuit board 10 as the base to support the diodes, transistors, resistors, etc., shown in FIGURE 1. Circuit connection are made on one or both surfaces of the circuit board, and all terminals, identified by capital and lower case letters, terminate in taper pin connections along one edge of the circuit board. Thus, the circuit board is a plug-in device to be held along one edge in a conventional socket (not shown).

Our package consists of input AND gating to receive one or more trigger (and other) signals. The trigger signals are gated into an OR gate 11 whose output line 24 constitutes the input trigger for a D.C. coupled amplifier 26. When the amplifier is in the quiescent or off state, the assertion output (pin *k*) is nominally at −6 volts and the negation output (pin *f*) is nominally at +6 volts. The +6 and −6 volt signals are nominal values only, but for convenience they are henceforth called ±6 volts. When the amplifier is in its second or "On" state (turned on by a trigger signal from the OR gate 11, or otherwise) the assertion output on pin *k* is at +6 volts and the negation output on pin *f* is at −6 volts. As is well known in the art, these pairs of signals, which swing about an arbitrary reference provide functions and not-functions respectively which are most useful in the construction of electronic equipment using logic. We have found that the inclusion of negative and positive differentiators 70 and 72, and a delay network, for instance RC circuit 74, will make our logic package exceedingly versatile in the fabrication of logic devices such as a one shot multivibrator (FIGURE 4) an oscillator, a counter, a shift register, and many others. Some of the others are listed later.

*Gating*

Attention is directed to FIGURE 1. At the upper left corner the power input pins A, B and C are connected to an external ±6 volt power source and ground. Supply filter capacitors 12 and 14 are connected between the power supply lines and the ground connection. As indicated on the drawing the +6 and −6 volts supply pins A and C are connected through resistors or diodes to various points in the circuit.

There are four AND gates, each with four inputs to receive trigger signals, whose ultimate purpose is to control the amplifier, i.e. turn it on or off. Each AND gate is conventional, consisting of a plurality of diodes and current-drawing resistors connected to the positive potential source pin A. The output lines 16, 18, 20 and 22 of the four AND gates form inputs to a conventional diode OR gate 11 whose output on line 24 is the trigger signal line for amplifier 26. The construction and operation of the amplifier is described later.

We have indicated that our four AND gates are conventional diode gates. However, it is often useful, if not absolutely necessary, to have an AND gate of more than four entries. Therefore, AND gates J–M and P–T can be coupled by a jumper extending across pins N and U. Thus, this pair of gates may be combined to form a single eight-entry AND gate. Although we use the term "jumper" herein, the "jumper" is not ordinarily attached to the circuit board 10. Since our circuit board is a plug-in device it is usually much more convenient to have the jumper connected across the parts of the socket into which pins N and U are inserted.

The signal current for the AND gates is supplied through resistors 28 and the connection to the positive source of potential (pin A). Thus, if any input to an AND gate is held negative, the current drawn through its resistor 28 will not be conducted by line 24 to the amplifier 26, but instead, will flow through the diode associated with the negative input. Therefore, all of the inputs to an AND gate must be at a positive potential to allow the current provided by resistor 28 to flow over line 24 as an input (trigger) of the amplifier. Since the current can flow in only one direction (through the AND gate diodes) it is not possible for a single input signal to interfere with other uses of another input signal. Because of this, any of the AND gate diodes which are not connected, operate as though they are connected to a positive potential. This requires that a single input of each unused AND gate be connected to a −6 volt source.

Pin *d* is connected with an inhibit signal line 30 having a diode 32 therein and connected with the OR gate output bus 13. For the reasons mentioned above in connection with each of the AND gates, if a negative signal is applied to pin *d*, none of the AND gates can supply current over line 24 to trigger the amplifier 26. Thus, a negative signal applied to pin *d* inhibits the package. Pin *e* termed "base" in FIGURE 1 (because it is ultimately) connected to the base of the first transistor T–1 in the amplifier by way of trigger line 24) is to be used with additional external gates and/or for special functions usually involving additional packages to form logic elements (for example the quantizer shown in FIGURE 4).

*Amplifier*

As mentioned previously, amplifier 26 has one input line 24 and two outputs conducted on lines 38 and 40 terminating at assertion pin *k* and negation pin *f* respectively. With no signal applied to the NPN transistor T–1 over line 24, the amplifier is in the off state in which case the assertion output at pin *k* is at −6 volts and the negation output on pin *f* is +6 volts. When the amplifier is turned on, the assertion output is +6 volts and the negation output is −6 volts.

The base of transistor T–1 is connected through a resistor 42 to the −6 volt power supply, and this is sufficient to bias the transistor to cut off thereby establishing the quiescent state of the amplifier. When the transistor T–1 is cut off, +6 volts are applied to the base of the PNP transistor T–2 by way of resistor 44 and RC coupling 46 between the collector of transistor T–1 and the base of transistor T–2. The emitter of transistor T–2 is biased at +5.3 volts through diode 48 and resistor 50 connected to −6 volts power supply. Therefore, transistor T–2 is cut off if and when transistor T–1 is cut off.

The collector of transistor T–2 provides the previously mentioned assertion output conducted on line 38. An indicator lamp 52 attached to the assertion line and the −6 volt source, will become illuminated when the amplifier is on.

The final transistor T–3 has its base connected by RC coupling 54 to the collector of transistor T–2. The emitter of transistor T–3 is biased to +4.6 volts due to the diodes 56 and 58 and resistor 60 between the emitter and −6 volts supply. In the quiescent state of the amplifier, transistor T–3 is biased into conduction and the collector provides a negation output on line 40 appearing at pin *f*.

When an input signal is conducted on line 24 to the base of transistor T–1 sufficient current is applied to the base of transistor T–1 to cause it to conduct to the point of saturation. With transistor T–1 saturated, a current will flow through resistor 47 of RC coupling 46 to the base of transistor T–2, causing it to saturate. The output of this transistor then is available as the assertion output of the package. When transistor T–2 saturates, the current to the base of transistor T–3 is cut off whereby the negation output at point *f* will be nominally −6 volts.

Bias diode 48 biases the transistor T–2 so that the current drawn by resistors 44 and 47 may cut it off completely. Bias diodes 56 and 58 bias the transistor T–3 so that the transistor T–2 may cut it off completely. In order to improve the rise times of the circuit, the capacitors 49 and 55 and 64 are used as accelerator devices. Capacitor 64 in line 66 applies positive feedback from the assertion output to the base-input 24 of transistor T–1. The feedback loop makes it possible for normal signals to turn the package off immediately after it has been turned on.

*Additional networks*

The response of amplifier 26 is very fast. In order to take advantage of this inherent speed (and for other reasons) we have negative and positive differentiators 70 and 72 whose terminals are at pins, F, H and D, E respectively. The differentiators differentiate the input trigger signal for the package so that the package is turned on or off by what corresponds to the leading (or trailing) edge of an external (trigger) signal. For example, the trigger signal conductor may be attached at pin F as an input, and the pin H may be connected by a jumper to one of the inputs on one of the AND gates. Then, when the trigger signal occurs, the differentiated trigger signal in the form of a short pulse or "spike" is applied to the AND gate, passes the OR gate 11, and is impressed on the base of transistor T–1 by way of trigger signal conductor 24. It often happens that certain logic functions require the package to be turned on and off before the input signal terminates. In further explanation, assume that the input signal, serving as a trigger for the package, is a pulse which lasts for thirty-microseconds, but the logic circuit of which the package forms a part, requires the package to be on for only twenty microseconds. By differentiating the input signal and using only the "leading edge" (differentiated thirty-microsecond input pulse) the package can be turned on. Then the package can be turned off by using an inhibit signal, to meet the twenty microsecond requirement, even though the input trigger pulse is of a thirty microsecond duration.

Our package has an RC delay network 74 whose input and output pins are *h* and *j* respectively. The RC network 74 can be used for a number of purposes one of which is shown in FIGURE 2 where the package is used as a one-shot multivibrator. The time delay network 74 has a +6 volt input through resistor 76, diode 78 and capacitor 80 to ground. This charges the capacitor 80, and the potentiometer 82 (through diode 84) holds the level of charge on the capacitor. The RC time constant is varied by adjusting the level at which the capacitor 80 fires, either by adjusting the potentiometer 82 or by replacing the capacitor with another capacitor of a different value. Practical use of the RC circuit 74 is probably best exemplified when the package is used as a one-shot multivibrator. Therefore with the aid of FIGURE 2, a description of the operation of our package used as a one-shot multivibrator is given below. Basically, the RC circuit 74 is used as a switch to turn off the package after it has been turned on by an input trigger signal. Thus, the output of the package will appear as a pulse, whose duration corresponds to the time constant of the RC network 74. The one-shot arrangement shown in FIGURE 2 (operation described later) includes power connections at terminals A, B, and C. The trigger signal line 88 is connected to the input of one of the differentiators, for example, pin F, while the output of the same differentiator is conducted on jumper 90 which is applied to one of the AND gates, for instance pin L. As previously described, all of the unused AND gates must be connected to −6 volt sources and therefore lines 91 and 92 are connected to the two unused AND gates. The negation output pin *f* is connected by jumper 94 to the input pin *h* of RC circuit 74. The output pin *j* of the RC circuit is connected by jumper 96 to pin *b* of one of the AND gates. Another pin Z of the same AND gate has jumper 98 feeding a signal thereto from the assertion output *k* of the package. All of these connections are shown in FIGURE 2 as lines, but it is to be understood that practical application of our package would have the connections made by suitable conductors attached to a socket for an edge of the entire package.

The operation of the package as a one-shot multivibrator is as follows:

Assume that the package amplifier and its RC network 74 are in the quiescent state. As described previously, this means that the negation output at point *f* is +6 volts. Thus, the +6 volts signal is conducted over jumper 94 to the input pin *h* of the RC circuit meaning that point 79 of the RC circuit is at a positive potential limited only by the setting of potentiometer 82. Now assume that the package is switched on with an input trigger on line 88. After being differentiated, the input trigger signal appears as a narrow pulse on line 90 and turns on the package by way of pin L, OR gate 11 and signal line 24. When the package is turned on, the assertion output at point *k* swings from −6 volts to +6 volts, and the negation output at pin *f* swings from +6 volts to −6 volts. The negation voltage is conducted on jumper 94 thereby pulling down the cathode of diode 77 in the RC circuit. Due to this, resistor 76 and the anode of diode 78 are also pulled down. This cuts off or "disconnects" the cathode of diode 78. The capacitor 80 is now allowed to discharge since resistor 76 no longer is pulled up (positive). The discharge of the capacitor 80 is through resistor 81 to the −6 volt source connected therewith, and the voltage at point 80*a* assumes the characteristic RC type discharge. Point 80*a* is the RC output connected by jumper 96 to the AND gate pin *b*, and when its voltage drops to zero, the package is turned off because the AND gate in question is no longer satisfied. Summarizing to here, when the voltage conducted on jumper 98 swings from −6 to +6 volts the package is turned on because the gate containing inputs Z and *b* are both satisfied, pin *b* already being satisfied (+6 volts) due to the quiescent state charging of capacitor 80. The package is turned off suddenly because the assertion suddenly drops after the voltage on pin *b* crosses zero. As soon as the one shot has completed its cycle, the negation voltage at diode 77 suddenly swings to +6 volts allowing the capacitor 80 to be recharged from the +6 volt source thru resistor 76.

Figure 3:
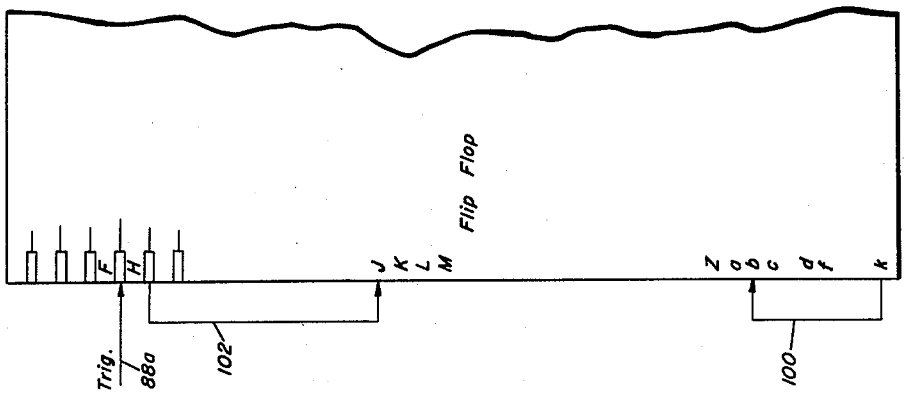
FIGURE 3 is a fragmentary elevational view showing connections to form a flip flop.

FIGURE 3 shows how the package may be used as a flip flop. The illustrated configuration is merely one of the numerous possible ways of using the package as a flip flop and the basic operation is to turn on the package by an incoming signal and have the package remain on (even after the trigger signal discontinues) until a "reset" signal from an external source is applied to the package. In the illustration assume first that the package is in the quiescent state in which the assertion output (−6 volts) is fed back on line 100 to one of the AND gates, e.g., pin *b*. Being negative, the signal is not capable of turning on the package. Now assume that the flip flop is to be set (turned on). A trigger signal on line 88*a* is differentiated so that the differentiated signal appears on line 102, which is fed to another of the AND gates. Thus, a differentiated signal turns on the package causing the assertion output conducted on jumper 100 to go positive. Even though the trigger signal is discontinued, the feedback on line 100 from the assertion (now +6 volts) keeps the package turned on, making available assertion and negation outputs at pins *k* and *f* respectively.

In this configuration it is not necessary to differentiate the trigger signal. It may be fed directly to the AND gate or gates involved so long as it is discontinued before the "reset" signal occurs. Here again, the package used as a flip flop, may be reset in a number of ways, such as providing an inhibit signal at pin *d* or a negative going signal to the same gate to which jumper 100 is connected.

Figure 4:
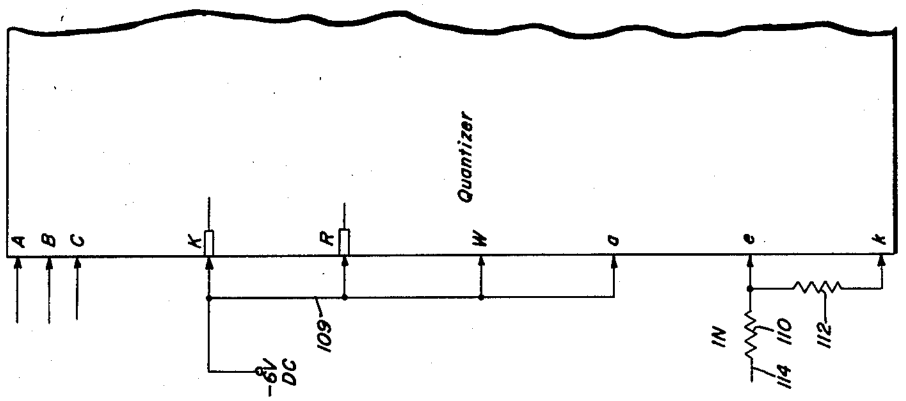
FIGURE 4 is a fragmentary elevational view showing that additional circuit components can be used to form other logic elements, such as the illustrated quantizer.

FIGURE 4 shows how the package may be used with additional components (resistors 110 and 112). The package in FIGURE 4 is used as a quantizer. All unused AND gates have −6 volts over line 109 fed thereto for reasons described before. To understand the quantizer configuration, FIGURE 4 should be considered in relation to the circuit of FIGURE 1. Although amplifier 26 saturates with normal signal inputs and responds very quickly in swinging between its two states, the amplifier may intentionally be placed in an uncertain state by the application of an abnormal signal such as the output of a potentiometer or photocell which would constitute the input of the package. Line 114 is assumed to conduct this kind of input to pin *e* and hence, to the base of transistorsistor T–1. When the current to resistor 110 becomes sufficient for current to flow in transistor T–2, resistor 112 will pass current from the assertion pin *k* to pin *e* through resistor 112. This current is sufficient to cause the amplifier 26 (and hence the package) to saturate in the "on" state. If the package is then to be turned off, the voltage at the input must be decreased enough to cancel the current through resistor 112. If the voltage at the input of this circuit is decreased enough so that the assertion output pin *k* becomes less positive, the resulting current change in resistor 112 will be sufficient to turn off the package very solidly. Accordingly, it is not possible to supply a voltage to the input of this circuit, such as will cause it to be in an intermediate state. As an alternative, the signal to the package amplifier may be fed through one of the AND gates instead of holding all of them to −6 volts D.C. as shown. This has the advantage of permitting the input to the quantizer circuit to be gated by external signals applied to other input terminals of that gate.

We have shown only a very few uses of our package. Our basic package may obviously be used as an AND gate or an OR gate. Several packages may be used together to form additional logic elements. For instance, a pair of one shot multivibrators which are arranged so that after one fires the next fires and then the original one fires again will constitute a free running oscillator. Flip-flops may be suitably connected to form a binary counter or shift register or a ring counter. There are such a large number of possibilities in using our package that each cannot be specifically discussed and shown but they will become readily apparent to persons familiar with logic functions and/or circuits. Accordingly, all modifications within the scope of the claims may be resorted to.

We claim:

1. In a multiple purpose logic package having gating means forming plural inputs for the package, an amplifier operable in a first and a second state respectively, direct current coupling means coupling said gating means with said amplifier for conducting a trigger signal to said amplifier to change the state of the amplifier in response to a trigger signal applied to said gating means, said amplifier having distinguishable first and second outputs which change to correspond to the state of said amplifier, a resistor capacitor circuit having a pair of terminals, means to connect one terminal with said first amplifier output, means for connecting the other resistor capacitor circuit terminal to said gating means, and means connecting the said second amplifier output to the same gating means so that when a trigger signal changes the state of said amplifier said resistor capacitor circuit is energized providing a delayed signal which is fed back to said gating means to again change the state of said amplifier thereby making available a one-shot output whose duration corresponds to the time constant of said resistance capacitance circuit.

2. The package of claim 1 wherein there are means to adjust said resistor capacitor time constant to thereby adjust the duration of said one-shot output.

3. The package of claim 1 and said package having a differentiator for its input trigger signals enabling the package amplifier to be gated on and off again by the leading or trailing edges of a pulse of any duration.

References Cited by the Examiner

UNITED STATES PATENTS

| | | | |
|---|---|---|---|
| 2,516,201 | 7/50 | Goodwin | 330—148 |
| 3,040,189 | 6/62 | Cramer | 307—88.5 |
| 3,090,943 | 5/63 | Lewis | 328—92 |

FOREIGN PATENTS

| | | |
|---|---|---|
| 1,231,705 | 4/60 | France. |

OTHER REFERENCES

"Symbolic Logic, Binary Calculation and 3C–PACs," by Robert W. Brooks, Computer Control Co., Inc., 1955.

"Descriptive Information and Technical Specification on the New Transistorized T–Pac One Megacycle Digital Modules," Computer Control Co., Inc., Oct. 30, 1957.

ARTHUR GAUSS, *Primary Examiner.*